United States Patent
Tatani

(10) Patent No.: US 7,800,684 B2
(45) Date of Patent: Sep. 21, 2010

(54) SOLID-STATE IMAGE PICKUP DEVICE AND IMAGE PICKUP APPARATUS WITH A LOW REFLECTIVE FILM ON THE SUBSTRATE

(75) Inventor: Keiji Tatani, Kangawa (JP)

(73) Assignee: Sony Corporation, Tokyo (JP)

( * ) Notice: Subject to any disclaimer, the term of this patent is extended or adjusted under 35 U.S.C. 154(b) by 457 days.

(21) Appl. No.: 11/745,723

(22) Filed: May 8, 2007

(65) Prior Publication Data

US 2008/0106626 A1 May 8, 2008

(30) Foreign Application Priority Data

May 9, 2006 (JP) .............................. 2006-130493

(51) Int. Cl.
*H04N 5/225* (2006.01)
(52) U.S. Cl. ....................................... 348/342; 257/294
(58) Field of Classification Search .................. 348/342
See application file for complete search history.

(56) References Cited

U.S. PATENT DOCUMENTS

| | | | | |
|---|---|---|---|---|
| 6,818,962 B2 * | 11/2004 | Yamamoto | .................. | 257/432 |
| 6,819,361 B1 * | 11/2004 | Lee et al. | ..................... | 348/342 |
| 2004/0202897 A1 * | 10/2004 | Kondo | ......................... | 428/701 |
| 2005/0018302 A1 * | 1/2005 | Yano et al. | ................... | 359/588 |
| 2007/0235771 A1 * | 10/2007 | Liu | ............................. | 257/223 |

FOREIGN PATENT DOCUMENTS

| JP | 59-018909 | * | 1/1984 |
|---|---|---|---|
| JP | 07-209516 | * | 8/1995 |
| JP | 2001-144280 | | 5/2001 |

* cited by examiner

*Primary Examiner*—Ngoc-Yen T Vu
(74) *Attorney, Agent, or Firm*—Sonnenschein Nath & Rosenthal LLP

(57) ABSTRACT

A solid-state image pickup device includes a semiconductor substrate 11, a photoelectric-conversion sensor portion 13 formed on the surface of the semiconductor substrate 11, a pixel area including an effective pixel portion 31 and an optical black portion 32 and a low reflective film 21 with low reflectance of infrared light formed on the back of the substrate 11. The solid-state image pickup device has satisfactory image pickup characteristics by suppressing an optical black optical level of the optical black portion from being fluctuated due to incidence of infrared light.

4 Claims, 3 Drawing Sheets

SOLID-STATE IMAGE PICKUP DEVICE AND IMAGE PICKUP APPARATUS WITH A LOW REFLECTIVE FILM ON THE SUBSTRATE

CROSS REFERENCES TO RELATED APPLICATIONS

The present invention contains subject matter related to Japanese Patent Application JP 2006-130493 filed in the Japanese Patent Office on May 9, 2006, the entire contents of which being incorporated hereby by reference.

BACKGROUND OF THE INVENTION

1. Field of the Invention

The present invention relates to a solid-state image pickup device including an optical black portion and an effective pixel portion and an image pickup apparatus that includes such solid-state image pickup device.

2. Description of the Related Art

Generally, in a solid-state image pickup device, an optical black portion in which a sensor portion is covered with a light-shielding film made of a metal such as aluminum (Al) with high light-shielding properties is provided in the outside of an effective pixel portion and a signal from this optical black portion (hereinafter referred to as an "OPB portion") is used as an optical black level (see patent Document 1 (Japanese Unexamined Patent Publication NO. 2001-144280), for example).

SUMMARY OF THE INVENTION

Incidentally, although infrared light can be shielded by a light-shielding film, infrared light is generally difficult to be absorbed as compared with visible light so that infrared light can propagate much better than visible light.

For this reason, infrared light which entered obliquely the effective pixel portion in which an opening is formed on the light-shielding film on the sensor portion reflects on the back of a substrate and enters the sensor portion of the optical black (OPB) portion so that photoelectric conversion occurs in the optical black (OPB) portion to cause a reference picture of the portion which determines an optical black level in the optical black (OPB) portion to change its color or to change its brightness.

Here, FIG. 1 of the accompanying drawings is a schematic constructional diagram (cross-sectional view) showing a solid-state image pickup device according to the related art.

As shown in FIG. 1, in the pixel of an effective pixel portion 31, an opening is formed on a light-shielding film (wiring layer 16) on a sensor portion 13 and hence infrared light L enters a silicon substrate 11.

Then, as shown in FIG. 1, it is frequently observed that the infrared light L that has obliquely entered the silicon substrate 11 reflects on the back of the silicon substrate 11 so that the infrared light L enters the sensor portion 13 of the pixel of the adjacent optical black (OPB) portion 32.

Infrared light is more difficult to be absorbed than visible light but infrared light may be absorbed a little.

In particular, since infrared light with a wavelength of from about 800 nm to 1300 nm is absorbed by silicon to some extent, if infrared light enters the sensor portion 13 of the pixel of the optical black (OPB) portion 32, then the incident infrared light is absorbed by the sensor portion 13, thereby causing photoelectric-conversion to occur.

In order to cope with the above-mentioned phenomenon, it has been customary to configure an image pickup apparatus such as a camera by using a solid-state image pickup device having at its front stage provided an infrared (IR)-cut filter which can block the transmission of infrared rays.

When the solid-state image pickup device is provided with the infrared-cut filter as described above, infrared rays can be prevented from entering not only the optical black (OPB) portion 32 but also the effective pixel portion 31.

However, since the infrared-cut filter that can block the transmission of infrared rays in a wide wavelength range is very costly, a problem arises, in which the image pickup apparatus becomes expensive unavoidably.

Also, an image pickup apparatus that may not afford the infrared-cut filter (for example, a surveillance camera using infrared light and a camera using infrared light to increase resolution) is unable to take a countermeasure such as the provision of the infrared-cut filter.

In view of the aforesaid aspects, the present invention intends to provide a solid-state image pickup device which has satisfactory image pickup characteristics by suppressing an optical black level of the optical black portion from being fluctuated due to incidence of infrared light and an image pickup apparatus including this solid-state image pickup device.

According to an aspect of the present invention, there is provided a solid-state image pickup device including a semiconductor substrate, a photoelectric-conversion sensor portion formed on the surface of the semiconductor substrate, a pixel area including an effective pixel portion and an optical black portion and a low reflective film with low reflectance of infrared light formed on the back of the semiconductor substrate.

According to another aspect of the present invention, there is provided an image pickup element including a solid-state image pickup device and an optical component for introducing incident light into the solid-state image pickup device. In the image pickup apparatus, the solid-state image pickup device includes a semiconductor substrate, a photoelectric-conversion sensor portion formed on the surface of the semiconductor substrate, a pixel area including an effective pixel portion and an optical black portion and a low reflective film with low reflectance of infrared light formed on the back of the semiconductor substrate.

According to the above-mentioned arrangement of the solid-state image pickup device of the present invention, since the low reflective film with low reflectance of infrared light is formed on the backside of the semiconductor substrate which has the photoelectric conversion sensor portion formed on its front side, light reflected from the back of the semiconductor substrate can be decreased. As a result, it is possible to decrease infrared light introduced into the optical black portion after having been reflected on the back of the semiconductor substrate.

According to the above-mentioned solid-state image pickup device of the present invention, since infrared light introduced into the sensor portion of the optical black portion after having been reflected on the back of the semiconductor substrate can be decreased, it is possible to prevent a signal obtained from the pixel of the optical black portion from being changed due to infrared light incident on the sensor portion of the optical black portion.

Accordingly, it is possible to prevent problems in which an image to determine black level is caused to appear with different colors or brightness is caused to change.

Consequently, it is possible to configure a solid-state image pickup device with excellent image pickup characteristics.

Further, since infrared light, which enters the sensor portion of the optical black portion after being reflected on the back of the semiconductor substrate of the solid-state image pickup device, can be decreased, the infrared-cut filter that the image pickup apparatus includes can be made inexpensive or it can be removed from the image pickup apparatus. Also, even an image pickup apparatus in which the infrared-cut filter is not available is able to prevent the problems caused by reflected light of infrared light and it becomes possible to produce a satisfactory image.

According to the above-mentioned image pickup apparatus of the present invention, the image pickup apparatus includes the solid-state image pickup device with excellent image pickup characteristics to produce images with high image quality.

Also, the infrared-cut filter that blocks the transmission of infrared light can be made inexpensive or the infrared-cut filter can be removed from the image pickup apparatus.

DESCRIPTION OF THE PREFERRED EMBODIMENTS

The present invention will now be described in detail with reference to the drawings.

Figure 1:
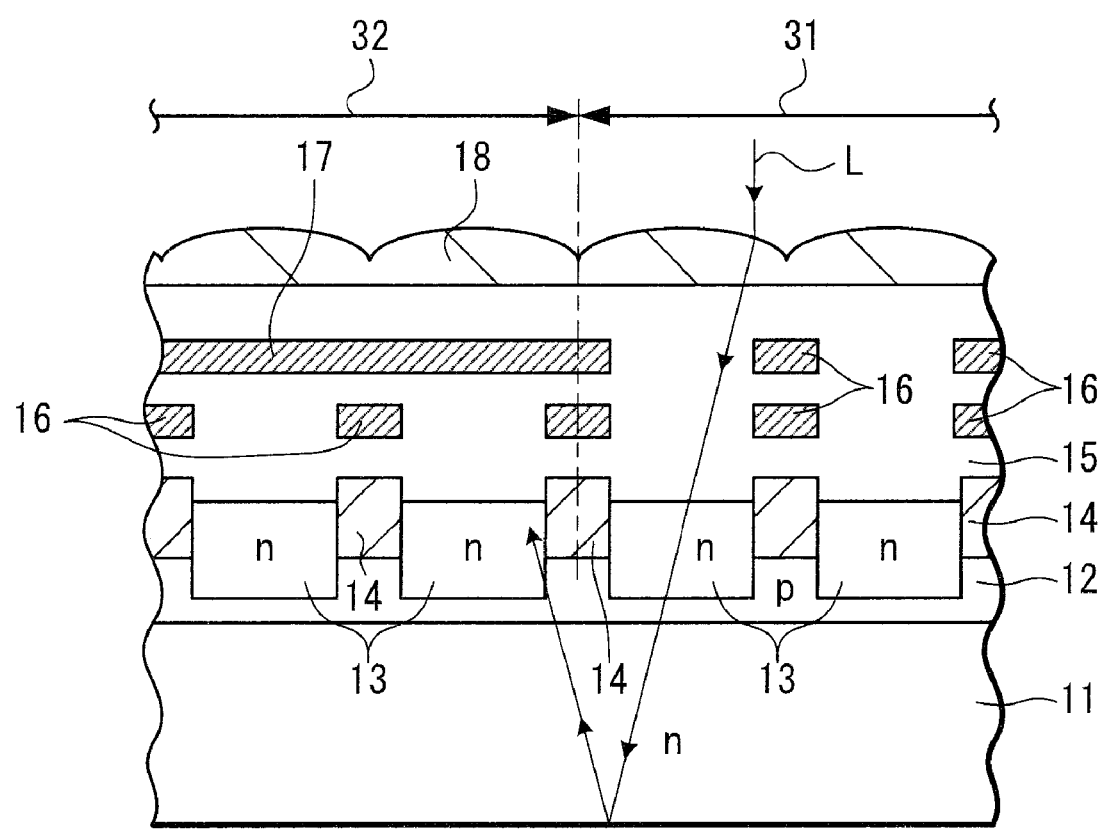
FIG. 1 is a schematic constructional diagram (cross-sectional view) showing a solid-state image pickup device according to the related art.
Figure 2:
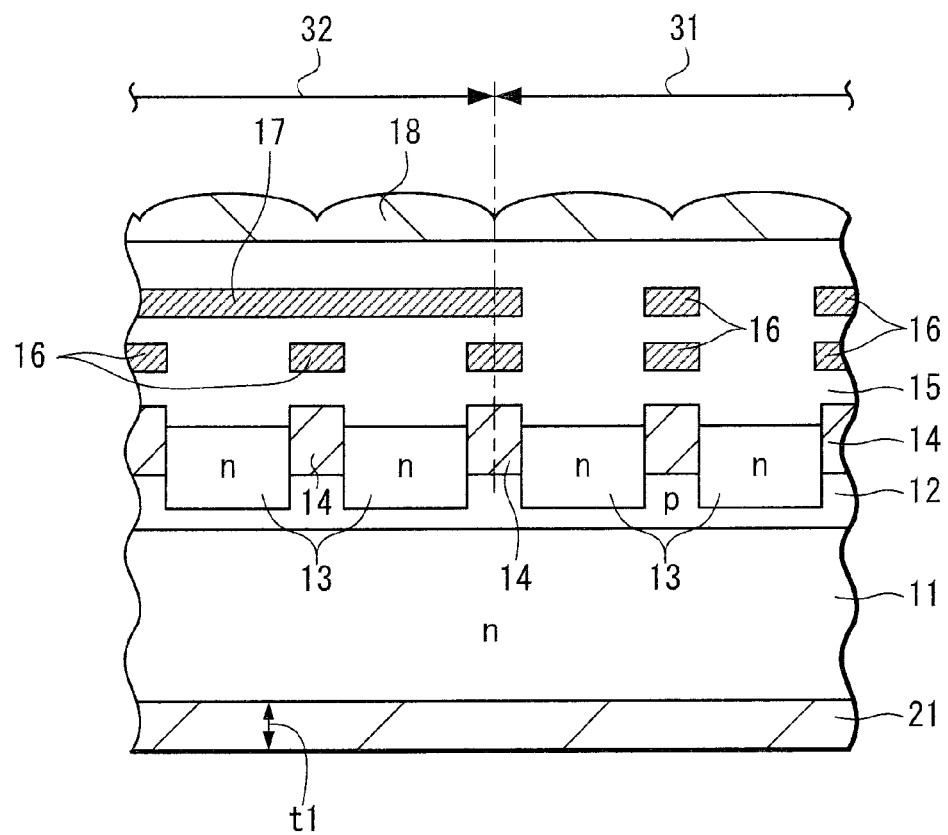
FIG. 2 is a schematic constructional diagram (cross-sectional view) showing a solid-state image pickup device according to an embodiment of the present invention.

FIG. 2 is a schematic constructional diagram (cross-sectional view) showing a solid-state image pickup device according to an embodiment of the present invention. The embodiment according to the present invention is a case in which the present invention is applied to a CMOS (complementary metal-oxide semiconductor) solid-state image pickup device.

As shown in FIG. 2, this solid-state image pickup device includes a first conductivity-type, for example, n-type silicon substrate 11, a second conductivity-type, for example, p-type semiconductor well region 12 formed on the surface of the n-type silicon substrate 11 and a photoelectric conversion sensor portion 13 formed within the p-type well region 12 on the surface side of the silicon substrate 11.

The photoelectric conversion sensor portion 13 is formed of an n-type semiconductor region and constructs a photodiode PD together with the p-type semiconductor well region 12.

The sensor portions 13 in each pixel are isolated from each other by an element isolation layer 14 formed of a $SiO_2$ layer, part of which is being buried into the silicon substrate 11.

A wiring layer 16 is formed above a silicon substrate 21 through an insulating layer 15.

The pixel area has a large number of pixels formed thereon and an optical black (OPB) portion 32 has pixels to determine an optical black level reference relative to the pixel of the effective pixel portion 31 which is used to obtain an image signal. Although not shown, the effective pixel portion 31 occupies the main portion of the pixel area and the optical black (OPB) portion 32 is formed at the end portion of the pixel area.

Then, in the pixel of the effective pixel portion 31, the wiring layer 16 of each layer has an opening over the sensor portion 13.

On the other hand, in the pixel of the optical black (OPB) portion 32, a wiring layer 17 of the uppermost layer serves also as a light-shielding layer as well and the wiring layer 17 is formed continuously so as to cover the sensor portions 13, thereby preventing light from entering the sensor portions 13.

An on-chip lens 18 is further provided on the upper layer of the wiring layer 16.

When the solid-state image pickup device according to the present invention is applied to a color solid-state image pickup device, a color filter is further provided under the on-chip lens 18 although not shown.

It should be noted that each pixel includes at its portion other than the cross-section shown in FIG. 2 a transistor portion including a transistor to read signal electric charges photoelectrically-converted by the sensor portion 13 or to convert signal electric charges into a voltage, thereby causing the converted voltage to be generated as a signal.

According to the embodiment of the present invention, in particular, a low reflecting film 21 with low reflectance of infrared light is formed on the backside of the silicon substrate 11 which includes the sensor portion 13 formed on its front side.

Then, as a specific arrangement of the low reflecting film 21, there is formed a film made of a material of which refractive index of infrared light has a relatively large difference between it and the silicon substrate 11.

Further, the low reflective film 21 should preferably have a film thickness t1 which is expressed as $t1=\lambda/(4n)$ where n assumes a refractive index of the low reflective film 21 and $\lambda$ assumes a wavelength of corresponding infrared light.

Since the low reflective film 21 having the above-mentioned arrangement is formed on the backside of the silicon substrate 11, light reflected on the back of the silicon substrate 11 and light reflected through the low reflected film 21 are caused to interfere with each other to weaken their intensities, thereby resulting in reflected light being decreased.

Here, a manner in which reflected lights interfere with each other to weaken so that reflected lights can decrease will be described with reference to a diagram of FIG. 3 which shows lights reflected on the back of the silicon substrate 11 shown in FIG. 2.

Figure 3:
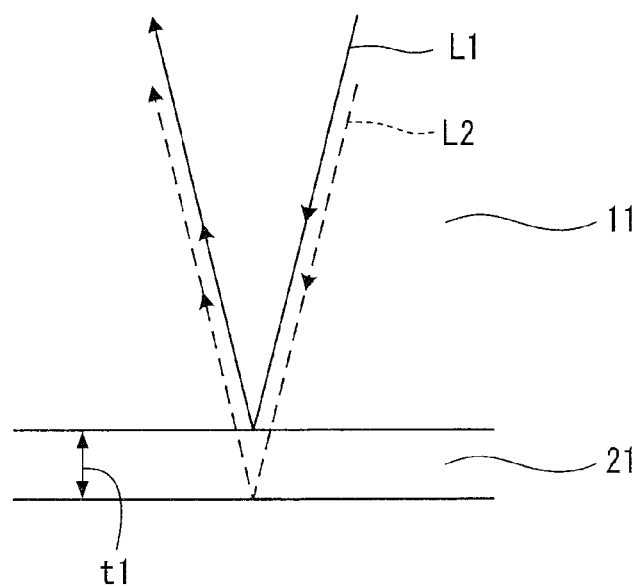
FIG. 3 is a diagram showing lights reflected on the back of the silicon substrate shown in FIG. 2.

Of lights entered the silicon substrate 11, one light L1 shown by a solid line in FIG. 3 is reflected on the back of the silicon substrate 11, that is, the boundary surface between the silicon substrate 11 and the low reflective film 21. Also, other light L2 shown by a broken line in FIG. 3 is reflected on the back of the low reflective film 21.

Here, since the low reflective film 21 has the film thickness of about $\lambda/(4n)$ relative to the wavelength $\lambda$ of the corresponding infrared light, an optical film thickness (film thickness x refractive index) becomes approximately $\lambda/4$ so that the light L2 reflected on the back of the low reflective film 21 is changed in phase, thereby being shifted in phase by ¼ period+¼ period=½ period. Since the phase of the light L2 is phase-shifted by the half period as described above, this reflected light L2 interfere with the light L1 reflected on the back of the silicon substrate 11 to thereby weaken their intensities. As a result, infrared light reflected from the back of the silicon substrate 11 is decreased and hence the reflectance of the infrared light in the low reflective film 21 is decreased.

It should be noted that, if the film thickness of the low reflective film 21 is selected to be $(2k-1)\lambda/(4n)$ (k is a natural number), then similar action and effects to those obtained when the film thickness of the low reflective film 21 is selected to be $\lambda/(4n)$ can be obtained.

However, if k is selected to be too large, it takes plenty of time to deposit the low reflective film 21 and hence k should preferably be selected in a range of from 1 to 3.

The wavelength $\lambda$ of the corresponding infrared light falls within a range of from 800 nm to 1300 nm which is a wavelength range in which infrared light can be absorbed by silicon and hence the optical film thickness (t1×n) of the low reflective films 21 should preferably be selected in a range of from about 200 nm to 1000 nm. When the wavelength $\lambda$ of the corresponding infrared light is 800 nm ($\lambda$=800 nm), the optical film thickness of the low reflective film 21 becomes $\lambda/4$=200 nm. When the wavelength $\lambda$ of the corresponding infrared light is 1300 nm ($\lambda$=1300 nm), the optical film thickness of the low reflective film 21 becomes approximately $3\lambda/4$=1000nm.

The low reflective film 21 may be made of organic materials that may be used in the on-chip color filter and the like and SiN, $SiO_2$, polycrystalline silicon, SiC, $Ta_2O_3$ and the like.

When the solid-state image pickup device according to the embodiment of the present invention is manufactured, the manufacturing process is provided with a process for forming the low reflective film 21 on the backside of the silicon substrate 11.

When the back of the silicon substrate 11 is not processed by a backgrind process, the process for forming the low reflective film 21 on the backside of the silicon substrate 11 can be carried out after the process of the front side of the silicon substrate 11.

According to the above-mentioned embodiment of the present invention, since the low reflective film 21 with low reflectance of infrared light is formed on the backside of the silicon substrate 11, light entered the sensor portion 13 after having been reflected from the back of the silicon substrate 11 can be decreased.

As a result, it is possible to prevent a signal obtained from the pixel of the optical black (OPB) portion 32 from being changed due to infrared light incident on the sensor portion 13 of the optical black (OPB) portion 32.

Accordingly, it is possible to prevent problems in which an image to determine an optical black level is caused to appear with different colors or brightness is caused to change. Consequently, it is possible to configure a solid-state image pickup device with excellent image pickup characteristics.

It is possible to configure an image pickup apparatus by using at least the solid-state image pickup device according to the embodiment of the present invention, the optical component for introducing incident light into the solid-state image pickup device, for example, a lens, a filter and the like.

It should be noted that the number of the solid-state image pickup device that the image pickup apparatus includes is not limited to one and that the image pickup apparatus may include a plurality of solid-state image pickup devices like an arrangement of a so-called three CCD (charge-coupled device) type image pickup apparatus including three solid-state image pickup devices.

Then, when the image pickup apparatus is configured by using the solid-state image pickup device according to the embodiment of the present invention, the infrared-cut filter can be made inexpensive and the infrared-cut filter can be removed from the image pickup apparatus.

Also, even the aforementioned image pickup apparatus in which the infrared-cut filter is not available can prevent the problem caused by the reflected light of the infrared light and it becomes possible to obtain excellent images.

It should be noted that other film such as a protective film can be formed on the backside of the silicon substrate 11 so as to cover the low reflective film 21.

Figure 4:
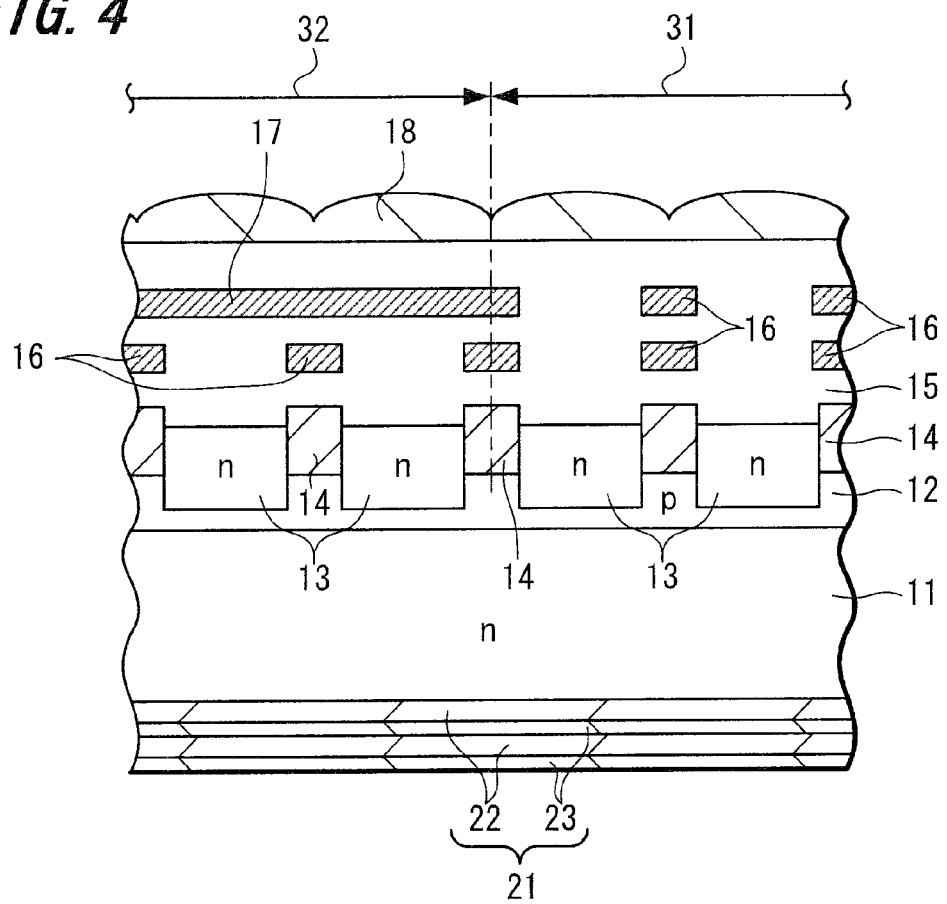
FIG. 4 is a schematic constructional diagram (cross-sectional view) showing a solid-state image pickup device according to other embodiment of the present invention.

Next, FIG. 4 is a schematic constructional diagram (cross-sectional view) of a solid-state image pickup device according to other embodiment of the present invention.

According to this embodiment, as shown in FIG. 4, the low reflective film 21 formed on the backside of the silicon substrate 11 is a multilayer film formed by alternately laminating two layers of first films 22 and second films 23 having large differences between refractive indexes of the infrared light.

A rest of the arrangement is similar to that of the preceding embodiment shown in FIG. 2. Therefore, in FIG. 4, elements and parts identical to those of FIG. 2 are denoted by identical reference numerals and need not be described.

As the materials of the first film 22 and the second film 23 of the low reflective film 21, there can be used the materials enumerated in the preceding embodiment, that is, organic materials used in the on-chip color filter and the like, SiN, $SiO_2$, polycrystalline silicon, Sic, $Ta_2O_3$ and the like.

Then, two materials with relatively large differences of refractive index may be selected from various kinds of materials. The first film 22 may be made of one of the selected two materials and the second film 23 may be made of the other material of the selected two materials.

For example, if a combination of SiN and $SiO_2$ is applied to the first and second films 22 and 23, then a difference between the refractive indexes of the first and second films 22 and 23 can be increased and also the first and second films 22 and 23 can be deposited easily and inexpensively.

Since the low reflective film 21 is formed by alternately laminating two layers, totally, four layers of the two films 22 and 23 with the different refractive indexes, the phase of light reflected on the back of the low reflective film 21 through the low reflective film 21 changes relative to that of light reflected on the back of the silicon substrate 11 and intensities of these lights may weaken due to interference so that infrared light reflected from the back of the silicon substrate 11 can be decreased.

The films thicknesses of the first and second films 22 and 23 are respectively set to proper ones in response to the refractive indexes of the useable materials and the like such that light passed through the low reflective film 21 and reflected on the back thereof interfere with the light reflected on the back of the silicon substrate 11.

When the film thicknesses of the first and second films 22 and 23 are set as described above, depending on the material available in this case, the total optical film thickness of the multilayer film of the low reflective film 21 becomes about 200 nm to 1000 nm substantially similarly to the case of the single layer film.

According to the above-mentioned embodiment of the present invention, since the low reflective film 21 with low reflectance of infrared light is formed on the backside of the silicon substrate 11, light entered the sensor portion 13 after having been reflected from the back of the silicon substrate 11 can be decreased similarly to the preceding embodiment of the present invention.

As a result, it is possible to prevent a signal obtained from the pixels of the optical black (OPB) portion 32 from being changed due to infrared light incident on the sensor portion 13 of the optical black (OPB) portion 32.

Accordingly, it is possible to prevent problems in which an image to determine an optical black level is caused to appear with different colors or brightness is caused to change. Consequently, it is possible to configure a solid-state image pickup device with excellent image pickup characteristics.

Also, since the low reflective film 21 is of the multilayer film formed by alternately laminating the first films 22 and the second films 23, as compared with the single layer film of the preceding embodiment of the present invention, it is possible to increase freedom required when to select materials and to set film thicknesses.

It is possible to configure an image pickup apparatus by using at least the solid-state image pickup device according to the embodiment of the present invention, the optical component for introducing incident light into the solid-state image pickup device, for example, a lens, a filter and the like.

Then, when the image pickup apparatus is configured by using the solid-state image pickup device according to the embodiment of the present invention, the infrared-cut filter can be made inexpensive and the infrared-cut filter can be removed from the image pickup apparatus.

Also, even the aforementioned image pickup apparatus in which the infrared-cut filter is not available can prevent the problem caused by the reflected light of the infrared light and it becomes possible to obtain excellent images.

While the low reflective film 21 is configured by alternately laminating the two first films 22 and the two second films 23 in the above-mentioned embodiments of the present invention, the laminated films may be more than three kinds of films and the number in which the films are laminated is not limited to two and can be changed freely. Also, the sum total of the laminated layers is not limited to an even number and it may be an odd number.

According to any arrangement, it is sufficient that the optical film thicknesses (refractive index and film thickness) of the respective layers may be set such that the phase of the reflected light should be shifted by $(2k-1)/4$ (k is a natural number) on the whole of the low reflective film.

Figure 5:
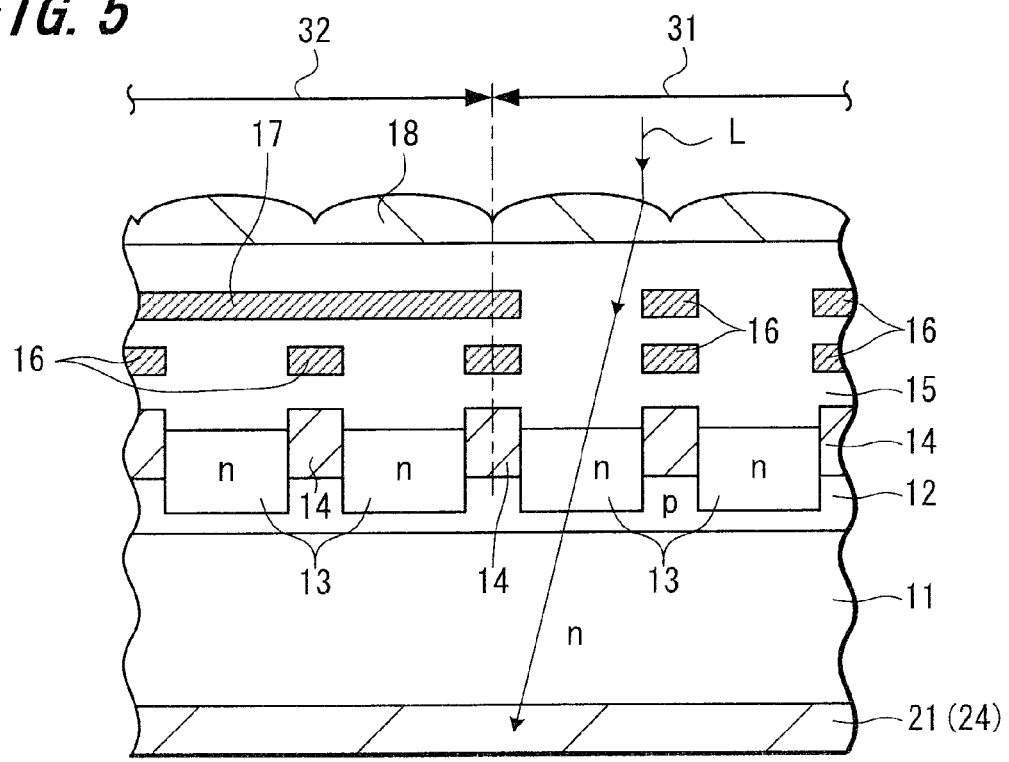
FIG. 5 is a schematic constructional diagram (cross-sectional view) showing a solid-state image pickup device according to a further embodiment of the present invention.

Subsequently, FIG. 5 is a schematic constructional diagram (cross-sectional view) showing a solid-state image pickup device according to a further embodiment of the present invention.

As shown in FIG. 5, a film 24 that may absorb infrared light is provided as the low reflective film 21 formed on the backside of the silicon substrate 11.

As a result, it is possible to decrease infrared light reflected from the back of the silicon substrate 11.

As the material of the film 24 that can absorb infrared light, there can be used various kinds of organic films for use with a color filter and the like insofar as they have properties that can absorb infrared light but that can block the transmission of infrared light.

More specifically, as the material of the film 24, it is possible to use such a material in which a phthalucyanine-based pigment is mixed into a polymer base material.

Since this embodiment according to the present invention makes effective use of absorption of infrared light and need not use interference of lights, the conditions of the film thickness of the low reflective film 21 can be alleviated as compared with those of the preceding embodiments. Therefore, the film thickness of the film 24 may be set considering that the film 24 is able to sufficiently absorb infrared light and that the film 24 can be deposited without plenty of time.

According to the above-mentioned embodiment of the present invention, since the low reflective film 21 formed of the film 24 that can absorb infrared light is formed on the backside of the silicon substrate 11, the light entered the sensor portion 13 after having been reflected on the back of the silicon substrate 11 can be decreased.

As a result, it is possible to prevent a signal obtained from the pixel of the optical black (OPB) portion 32 from being changed due to infrared light incident on the sensor portion 13 of the optical black (OPB) portion 32.

Accordingly, it is possible to prevent the problem in which an image to determine an optical black level is caused to appear with different colors or brightness is caused to change. Consequently, it is possible to configure a solid-state image pickup device with excellent image pickup characteristics.

It is possible to configure an image pickup apparatus by using at least the solid-state image pickup device according to the embodiment of the present invention, the optical component for introducing incident light into the solid-state image pickup device, for example, a lens, a filter and the like.

Then, when the image pickup apparatus is configured by using the solid-state image pickup device according to the embodiment of the present invention, the infrared-cut filter can be made inexpensive and the infrared-cut filter can be removed from the image pickup apparatus.

Also, even the aforementioned image pickup apparatus in which the infrared-cut filter is not available can prevent the problem caused by the reflected light of the infrared light and it becomes possible to obtain excellent images.

While the above-mentioned respective embodiments of the present invention have described the cases in which the silicon substrates are used as the semiconductor substrate in which the low reflective film is formed on the backside thereof, the present invention is not limited to those cases and can be applied to the cases in which semiconductor substrates other than the silicon substrate are used as the semiconductor substrate with the low reflective film formed on the backside thereof.

Also, a silicon epitaxial layer may be formed on the front side of the silicon substrate and the sensor portion may be formed within this silicon epitaxial layer.

It should be noted that, since other semiconductor (for example, compound semiconductor such as GaAs) has different infrared light absorption properties as those of silicon, a film thickness and the like may be set in accordance with infrared light absorption properties of such semiconductor.

Also, while the present invention is applied to the CMOS type solid-state image pickup device in the above-mentioned respective embodiments of the present invention, the present invention is not limited thereto and can be similarly applied to a solid-state image pickup device having other arrangement, for example, the CCD solid-state image pickup device having the optical black (OPB) portion like the above-described patent Document 1.

Further, in the present invention, the low reflective film is not always formed on the whole surface of the semiconductor substrate of the solid-state image pickup device or it is not always formed so as to extend over the end edge of the semiconductor chip and it is sufficient that the low reflective film may be formed on a little inside of the end edge of the semiconductor chip.

The present invention is not limited to the above-mentioned embodiments and it can take various arrangements without departing from the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
a semiconductor substrate;
a photoelectric-conversion sensor portion on the surface of said semiconductor substrate;
a pixel area including an effective pixel portion and an optical black portion; and
a low reflective film with low reflectance of infrared light on the back of said semiconductor substrate,
wherein,
said low reflective film is effective to cause interference between a first light reflected on the back of said semiconductor substrate and a second light reflected through said low reflected film thereby weakening the intensities of the first and second light.

2. A solid-state image pickup device according to claim 1, wherein said low reflective film is a multilayer film formed by laminating a plurality of films, each of which has a larger difference of refractive index.

3. A solid-state image pickup device according to claim 1, wherein said low reflective film is SiN, $SiO_2$, polycrystalline silicon, or $Ta_2O_3$ and said low reflective film is effective to absorb infrared light.

4. An image pickup apparatus comprising:
a solid-state image pickup device; and
an optical component for introducing incident light into said solid-state image pickup device, said solid-state image pickup device including:
a semiconductor substrate;
a photoelectric-conversion sensor portion on the surface of said semiconductor substrate;
a pixel area including an effective pixel portion and an optical black portion; and
a low reflective film with low reflectance of infrared light on the back of said semiconductor substrate,
wherein,
said low reflective film is effective to cause interference between a first light reflected on the back of said semiconductor substrate and a second light reflected through said low reflected film thereby weakening, the intensities of the first and second light.

* * * * *